(12) United States Patent
Mun et al.

(10) Patent No.: US 7,166,900 B1
(45) Date of Patent: Jan. 23, 2007

(54) SEMICONDUCTOR MEMORY DEVICE

(75) Inventors: Jin Suk Mun, Gauting (DE);
Wen-Ming Lee, Munich (DE); Rainer Bartenschlager, Kaufbeuren (DE);
Christian Sichert, Munich (DE);
Florian Schnabel, Hohenkirchen (DE)

(73) Assignees: Infineon Technologies AG, Munich (DE); Nanya Technologies Corporation, Taoyuan (TW)

( * ) Notice: Subject to any disclaimer, the term of this patent is extended or adjusted under 35 U.S.C. 154(b) by 0 days.

(21) Appl. No.: 11/205,402

(22) Filed: Aug. 17, 2005

(51) Int. Cl.
*H01L 31/058* (2006.01)

(52) U.S. Cl. .................. 257/467; 257/469; 365/211

(58) Field of Classification Search ........ 257/467–470, 257/296; 365/211
See application file for complete search history.

(56) References Cited

U.S. PATENT DOCUMENTS

| | | | | |
|---|---|---|---|---|
| 5,793,691 | A | * | 8/1998 | Mullarkey .................. 365/211 |
| 6,556,496 | B2 | * | 4/2003 | Benedix et al. ............. 365/222 |
| 6,809,968 | B2 | * | 10/2004 | Marr et al. ............ 365/185.24 |
| 6,850,448 | B2 | * | 2/2005 | Schnabel et al. ........... 365/211 |

* cited by examiner

*Primary Examiner*—T. N. Quach
(74) *Attorney, Agent, or Firm*—Jenkins, Wilson, Taylor & Hunt, P.A.

(57) ABSTRACT

A semiconductor memory device comprises a temperature dependent voltage source for outputting a voltage at its output in dependence on a temperature measured in the semiconductor memory device. At least one memory cell is provided with at least one first transistor. The first transistor includes a first transistor body, which is connected to the output of said temperature dependent voltage source.

10 Claims, 6 Drawing Sheets

SEMICONDUCTOR MEMORY DEVICE

TECHNICAL FIELD

The present invention relates to a semiconductor memory device, in particular to semiconductor memory device compensated for temperature drifts, and a method for operating the afore-mentioned semiconductor memory device.

BACKGROUND ART

Although the underlined problem of the present invention will be described with a relation to DRAM memory devices the present invention is not limited thereon, but relates to any semiconductor memory device.

DRAM memory devices are currently used in a plurality of battery powered applications. A desired operating time of these applications sets limits on a power consumption of the memory devices. A significant reduction of the power consumption is achieved by lowering the operating voltage of the memory devices.

Memory devices with a lowered operating voltage are desired to have the same operating speed and access time to the information stored in the memory device as power consuming devices. But the switching speed of the transistors in the memory devices increases along with a lowered operating voltage. This can be compensated for by decreasing a threshold voltage of these transistors in parallel such that their switching speed is maintained.

In a DRAM an information unit is stored as a charge in an isolated capacitor provided within a memory cell. The charge can be accessed via a transistor. In order to prevent loss of the information this transistor must have good isolation properties under all operating conditions. Therefore, a difference of the threshold voltage of the transistor to the lower operating voltage must be sufficiently large such that unintentional voltage fluctuations in a control line of this transistor will not switch unintentionally the transistor in a conductive state. Thus a lower limit on the threshold voltage is given due to restrictions on the reliability of the memory device.

Thus a trade-off of low power consumption is given which demands for a low operating voltage and a high-speed operation demanding for a large relation of the operating voltage with respect to the threshold voltage under the constraint of a minimal threshold voltage.

The memory device must operate properly for all temperatures in its operating temperature range. The threshold voltage of a transistor decreases along with rising temperature and is at its lowest level at the highest operating temperature. The transistors are designed such that this lowest level is above or equal the afore mentioned minimal threshold voltage for ensuring a reliable operation.

At low temperatures, however, the threshold voltage of the transistor is large rendering the operating speed low due to its dependence on the threshold voltage. Thus a semiconductor memory device using such transistors will have long access times to memory cells and a low data throughput at low temperatures.

SUMMARY OF THE INVENTION

It is an object of the present invention to provide a semiconductor memory device being operable at high speed over a large temperature range.

It is a further object to provide a method for operating a semiconductor memory device such that it becomes insensitive to temperature variations.

The object is achieved in accordance with the invention by a semiconductor memory device. This semiconductor device comprises a temperature dependent voltage source for outputting a temperature dependent voltage. The temperature dependent voltage increases with an increasing determined temperature and decreases with decreasing determined temperature. At least one memory cell is provided with at least one first transistor, which includes a first transistor body. The first transistor body is connected to said output of the temperature dependent voltage source.

The further object is achieved in accordance with the invention by operating the semiconductor memory device as follows. The semiconductor memory device comprises at least one memory cell, which itself comprises a transistor having a transistor body. A temperature of the semiconductor memory device is determined. A temperature dependent voltage source is provided for outputting a voltage, wherein the voltage increases when the determined temperature increases and the voltage decreases when the determined temperature decreases. The voltage is applied to the transistor body.

A basic idea which the present invention is based on is the fact that by applying a voltage to the transistor body, the threshold voltage increases. This compensates for a decrease of the threshold voltage caused by a rising temperature.

The transistor body is defined as an integral semiconductor area in which or on which source and drain areas are provided and in which the conductive gate channel is formed.

The dependent claims give advantageous refinements and improvements to the manufacturing method and the semiconductor device.

Information is represented by a charge stored in a memory cell. After a read signal and address signals are provided to a memory device a wordline respective to the address is pushed to a high level. Then a potential step due to the flowing charge in bitlines connected to the same memory cell is amplified via a first sense amplifier and then sensed by a second sense amplifier.

The bitlines are having a resistance and a capacity. This limits the slew rate of the potential step. Further, an application of a voltage to the transistor body decreases the slew rate. A reliable operation for the second sense amplifier demands to wait until a stationary state of the bitlines is established and before a sensing of the bitlines can take place. Therefore, a time delay is necessary between a start of the sensing with the second sense amplifier and the pushing of the wordline to a high level. A single delay amount can be chosen for all operating temperatures and applied voltages to the transistor body. But an increase of the operating speed may be obtained by the following preferred embodiment.

According to a particular preferred embodiment the semiconductor memory device comprises a read controller for outputting a read control signal. A read detection unit is connected downstream to the read controller and connected to the memory cell. The read detection unit is arranged for reading or sensing a content of the memory cell upon receipt of the read control signal. A delay unit is arranged between the read controller and the read detection unit. The read controller is arranged for delaying the read control signal. The delay unit comprises at least one second transistor having a second transistor body. The second transistor body is connected to the output of the temperature dependent voltage source.

According to a further particular preferred embodiment the semiconductor memory devices comprises a precharge control unit for providing a precharge control signal. A precharge unit is connected downstream of the precharge control unit. The precharge unit equalizes a potential of a pair of complementary bit lines connected to a memory cell until receipt of the precharge control signal. A delay unit is arranged between the precharge unit and the precharge control unit and delays the precharge control signal. The delay unit comprises at least one second transistor having a second transistor body. The second transistor body is connected to the output of the temperature dependent voltage source.

It is necessary to maintain a precharge operation of the bitlines until the potential of the bitlines is equalized and/or raised/lowered to a predetermined voltage. Upon application of a voltage to the transistor body the necessary duration for the precharge operation is increasing. The aforementioned embodiment encounters this problem by delaying the precharge control signal which terminates the precharge operation. The limited duration of the precharge operation economizes a power consumption. Thus, advantageously, this embodiment is less power consuming then a device using a constant delay for all operating temperatures.

According to a refinement the delay unit comprises an even number of NOT-Gates. At least one of the NOT-gates comprises the second transistor.

In a further refinement at least one of the NOT-gates comprises a forth transistor. The forth transistor comprises a third transistor body of a second conductivity type opposite to the first conductivity type. The temperature dependent voltage source outputs a second voltage of opposite sign to the voltage at a second output. The second output is connected to the forth transistor body.

Exemplary embodiments of the invention are illustrated in the drawings and explain in grater detail in the following description.

BRIEF DESCRIPTION OF THE DRAWINGS

In the FIGS. 1 to 6 identical reference numerals denote identical or functionally equivalent parts.

DETAILED DESCRIPTION OF THE INVENTION

A plurality of different semiconductor memory forms, including SRAM, DRAM, ROM, EPROM etc., are known in the state of the art. They all include a plurality of memory cells which each comprise at least one transistor for controlling an access to the data store and the memory cell. This transistor is critical for the operation speed of the memory device.

The operation speed is limited by the swing time necessary for the transistor to swing from a non-conductive to a conductive state. This time can be reduced by reducing the threshold voltage of the transistor. It has to be ensured that the threshold voltage is chosen large enough such that parasitic effects do not switch the transistor from a non conductive into a conductive state. If so later would lead to a loss of information in the memory cells.

At present a threshold voltage of about 0.2 V is achievable for transistors manufactured by semiconductor processing schemes of the present state of the art. The threshold voltage, however, decreases along with increasing temperature of the semiconductor device. Transistors working perfectly at room temperature might fail at elevated temperatures. Thus, transistors are used which are having a threshold voltage which is above a minimal threshold voltage over the whole operating temperature range.

Figure 1:
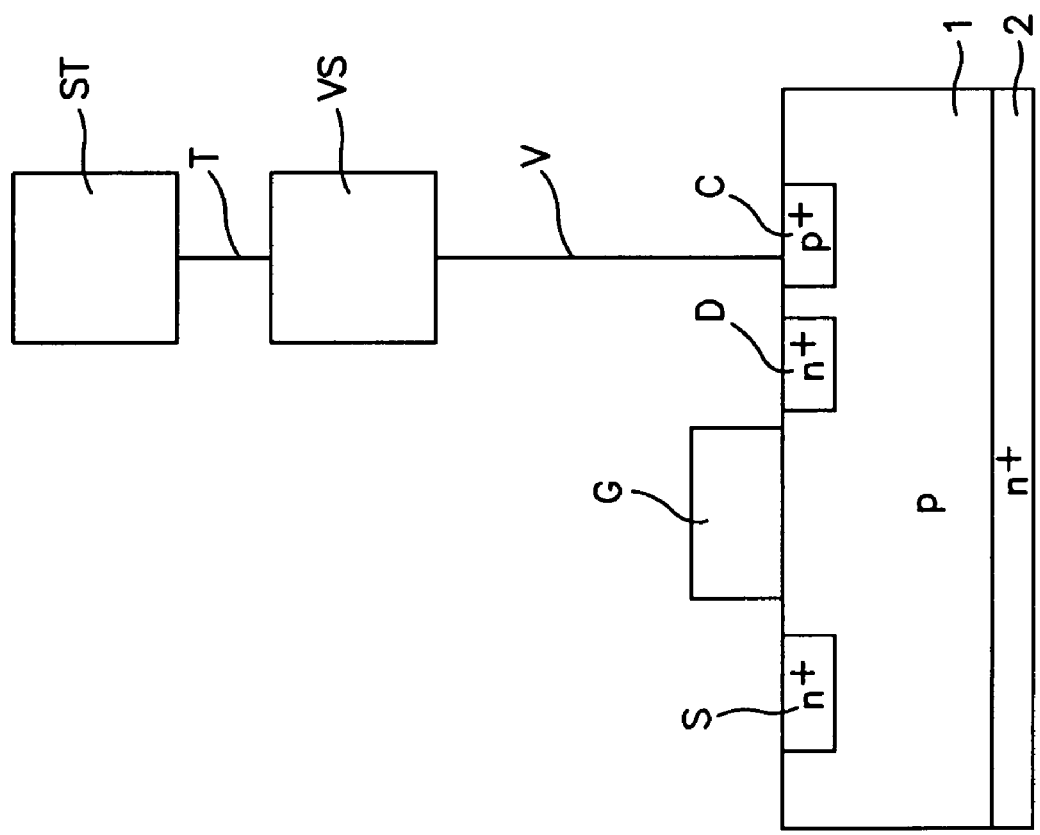
FIG. 1 shows a partial cross section of a transistor used in one embodiment of the present invention.

In an embodiment of the present invention a transistor is provided having a constant or near constant threshold voltage over a large operating temperature range. Such a transistor is illustrated in a cross section in FIG. 1. A transistor body 1 made of a semiconductor material of first doped n-type is provided with an embedded source S and drain area D of a second conductivity type n. The transistor body may be isolated to a substrate (not illustrated) via a layer 2 of a second conductivity type. Isolation trenches are commonly arranged around the side walls of the transistor body 1. Additionally, a control area C of the first conductivity type p is embedded in the transistor body 1. This control area C is connected to a temperature dependent voltage source VS. A negative voltage V applied to the control area increases the absolute value of the threshold voltage. Thus, this voltage V is usable for compensating a drift of the threshold voltage over the temperature. An input of the temperature dependent voltage source is connected to a temperature sensor ST for receiving a signal corresponding to a temperature T of the semiconductor memory device. Thus, the output voltage V is controlled in dependence on a temperature T of a voltage temperature characteristic such that the threshold voltage of the transistor remains constant over the operating temperature range. A preferred voltage temperature characteristic provides a linear relation wherein the voltage is rising with a rising temperature.

Figure 2:
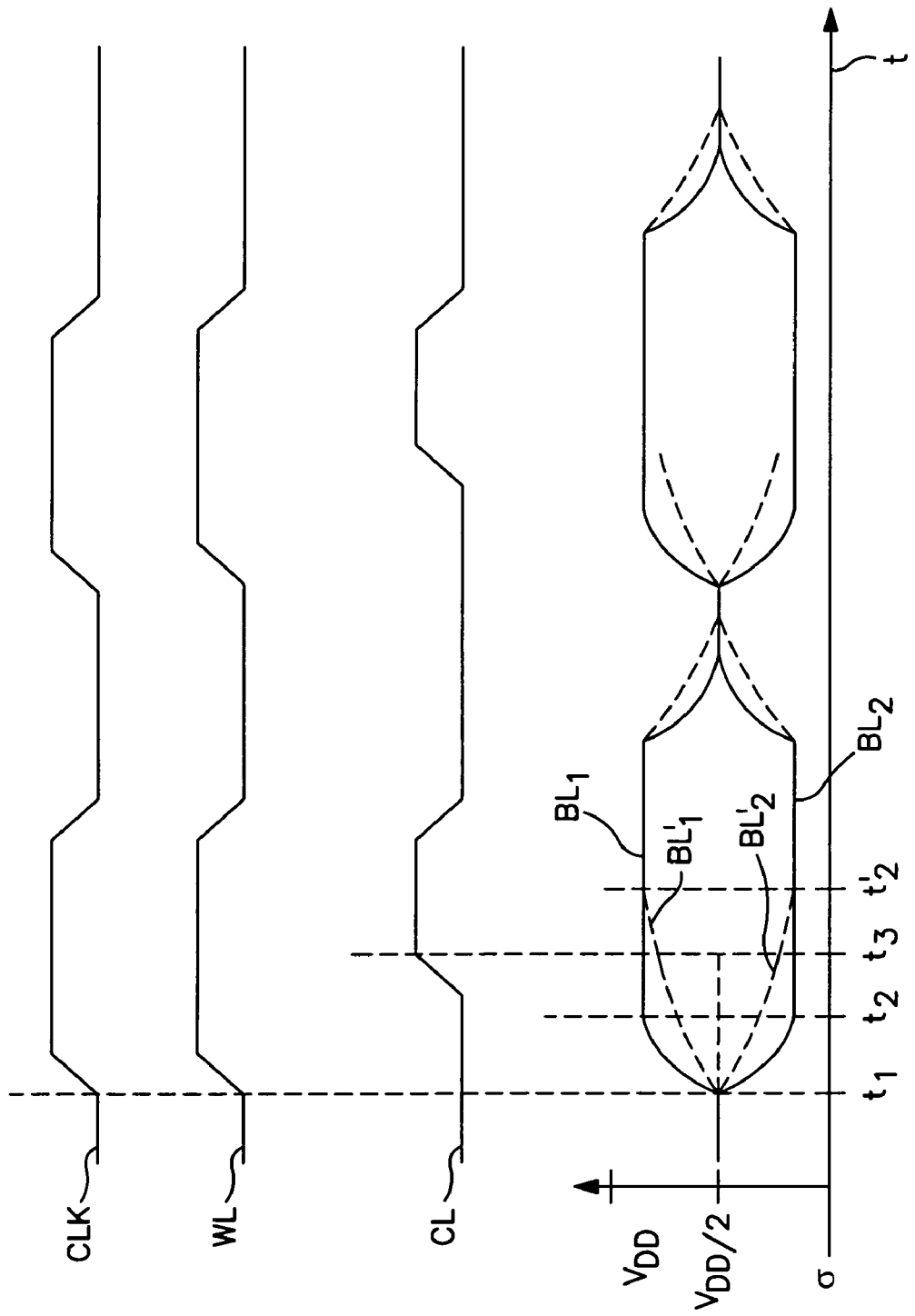
FIG. 2 illustrates a timing diagram of an embodiment of the present invention.

FIG. 2 illustrates a simplified timing diagram for a read operation of one embodiment of the present invention. Synchron to a clock signal CLK a wordline WL is raised to a high level at the time point $t_1$. Without limitation there may be a delay between the rising edges of the clock signal CLK and the wordline signal WL. At the time point $t_1$ a memory cell connected to the wordline is accessed and its transistor switched conductive. Charge stored in the memory cell flows into the bitlines $BL_1$, $BL_2$ connected to the memory cell. Thus, the potentials of the bitlines $BL_1$, $BL_2$ are rising and falling, respectively. At a time point $t_2$ the potentials of the bitline $BL_1$, $BL_2$ are close or are in a stationary state. The time between $t_1$ and $t_2$ will be called rising time herein after. The rising time depends on the switching characteristics of the transistor connected to the wordline and the bitlines and of the resistance and capacity of the bitlines. A read out of the potential of the bitline BL may be executed when it is ensured than the bitline will have achieved a stationary state, in FIG. 2 after $t_2$. The read operation is triggered by a column line clock signal CL at a time point $t_3$. The column lines select signal CL is delayed with respect to the wordline signal WL by the time difference $t_3-t_1$ which is longer than the rising time by a safety margin. This safety margin is chosen as small as possible in order to achieve a high operating speed.

In case a temperature controlled voltage is applied to the transistor body 1 not only the threshold voltage is increased, but the switching time of the transistor is increased as well. Thus, the rising time of the potential in the bitlines BL', BL is longer, i.e. the slew rate decreases. Thus, when the read out of the bitlines is started with the rising edge of the column line select signal CL at the time point $t_3$ the bitlines BL'$_1$, BL'$_2$ do not reach the stationary state. This may lead to read out errors as the potential difference between the two bitlines BL'$_1$ and BL'$_2$ may be still below a lower detection limit. Such errors can be prevented by defining the delay of the column select line signal with respect to the wordlines signal to be longer or equal to the longest rising time which may be expected for all temperature controlled voltages. However, this will reduce significantly the operating speed of the memory device.

Figure 3:
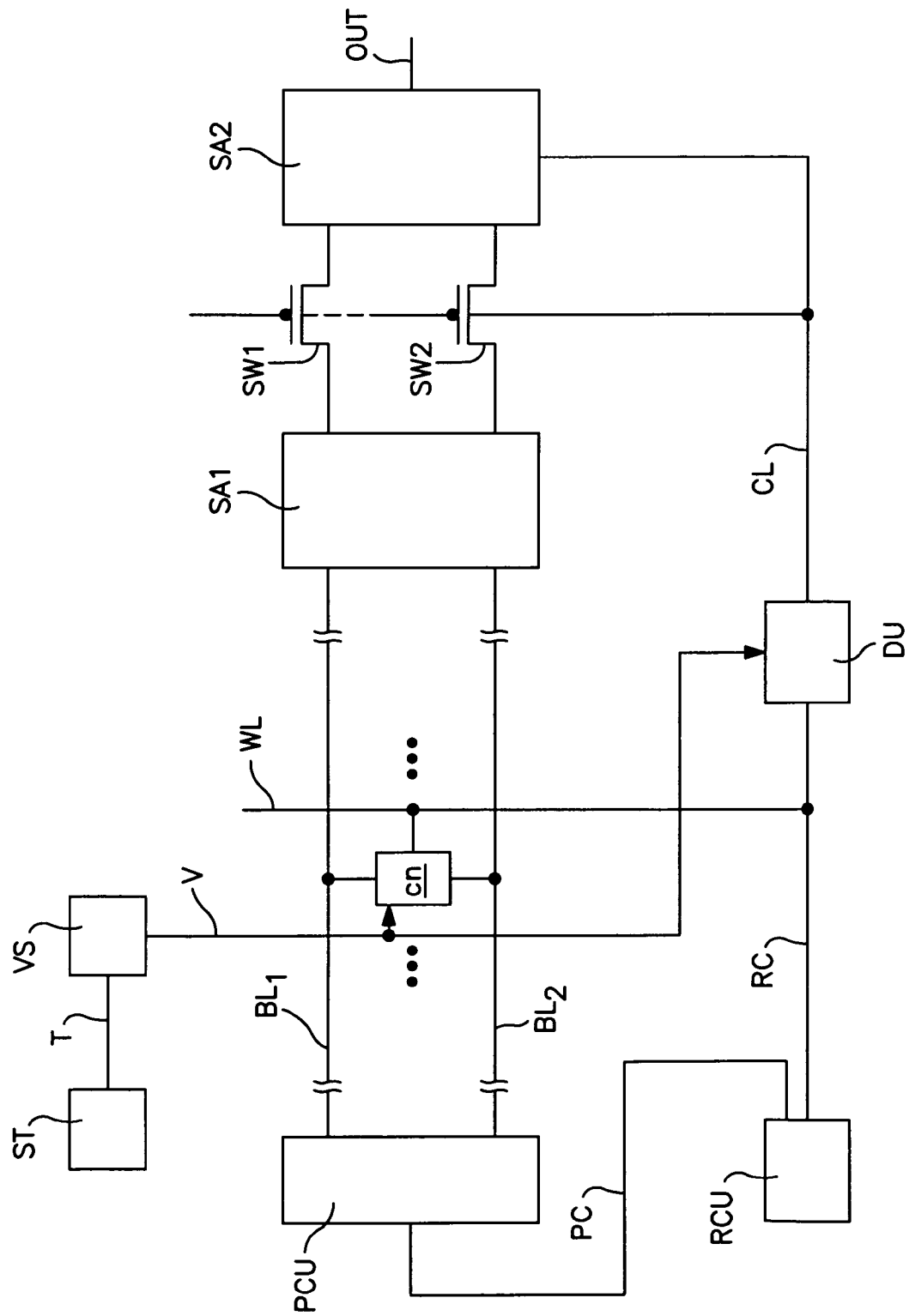
FIG. 3 shows a block diagram of an embodiment of the present invention.

FIG. 3 shows a block diagram of a particular preferred embodiment of the present invention. One of plurality of memory cells C is connected to a wordline WL (wirings and signals transmitted over these wirings are denoted by the same reference numerals) and two bitlines, i.e. a true bitline $BL_1$ and a complementary bitline $BL_2$. A read control unit provides a read command RC which is passed directly or intermediately by additional circuits (not shown) to the wordline. At the moment the wordline signal is active the charge stored in the memory cell is transferred to the bitlines. The change of the potential of the two bitlines is sensed by a first sense amplifier SA1 connected to these bitlines. In a second stage a second sense amplifier SA2 is connected to the first sense amplifier SA1 via two switching devices SW1, SW2. These switching devices are turned conductive only in presence of a column line select signal. Additionally, the second sense amplifier SA1 may be active only when the column line select signal CL is present. The column line select signal CL is generated by a delay unit DU by delaying the read control signal RC. This delay unit control is provided with a control input which is connected to the temperature temperature dependent voltage source VS. This temperature controlled voltage source may be identical or in principle identical to the voltage source connected to the transistor body of the memory cell C.

Figure 4:
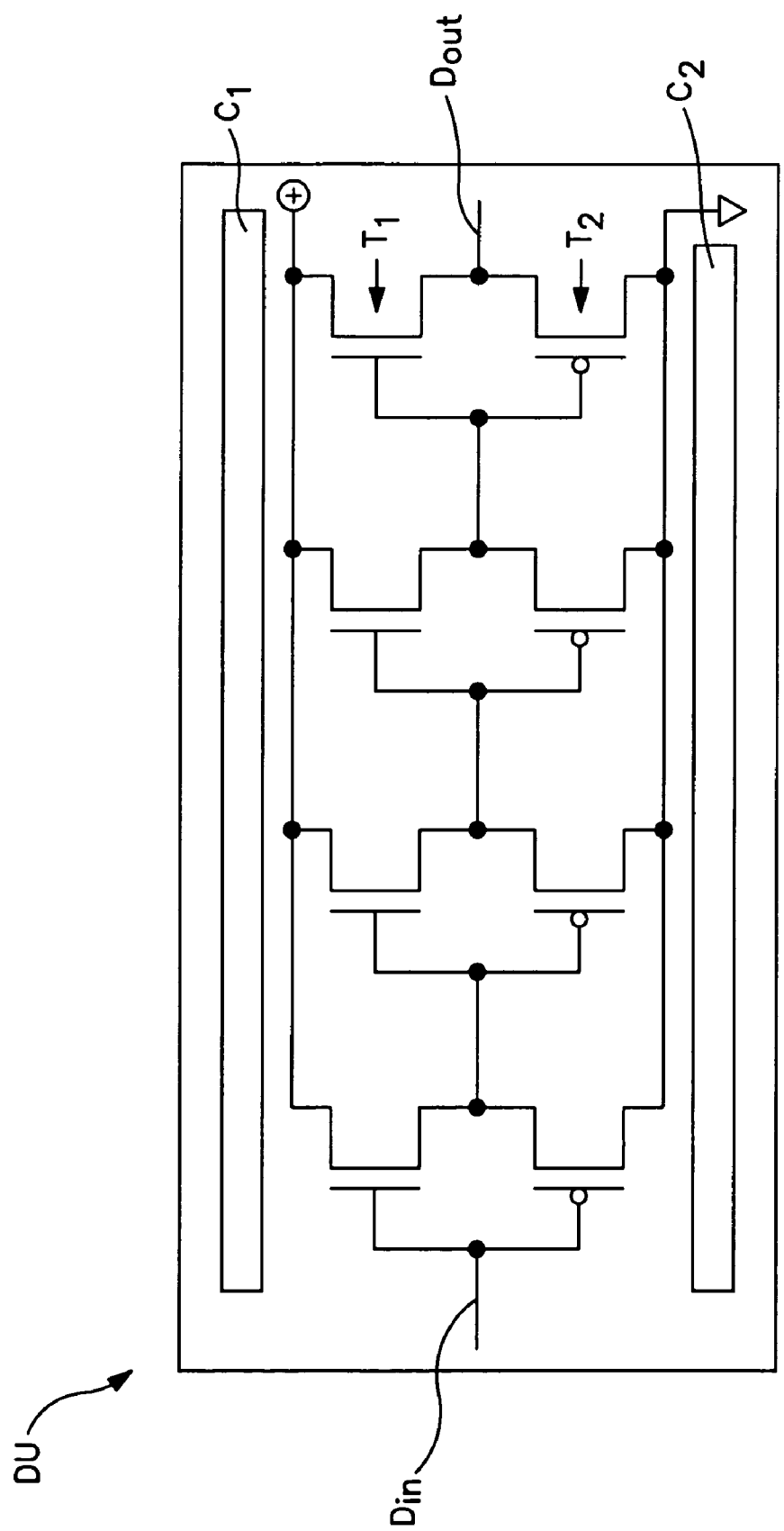
FIG. 4 schematically illustrates a delay unit used in embodiments of the present invention.

FIG. 4 illustrates schematically one possible realisation of such a delay unit. An even number of NOT-Gates are provided between an input side Din and an output side Dout. The delay provided by this delay unit is mainly defined by the number of the NOT-Gates and their respective transition times. Thus, the member of the NOT-Gates is chosen such that the delay equals the rising time of the potential of the bitline BL. Each NOT-Gate comprises two complementary transistors T1, T2. The transistor body of at least one type of transistors T1 of the inverted chain is provided with a control area $C_1$ to which a control voltage is applied. Along with an increasing control voltage the switching speed of the transistor T1 is decreasing, and in consequence the delay of the delay unit DU is rising. A second control area C2 may be applied to the transistor body's of the complementary transistors T2. An increasing control voltage applied to this second control area C2 increases as well the transition time of these transistors T2 and in consequence the delay of the delay unit DU is rising.

The control voltage applied to the control areas C1 and/or C2 is based on the temperature controlled voltage V provided by the temperature dependent voltage source VS.

Thus, the delay provided by the delay unit DU increases in parallel to the rising time of the data signal of the memory cell C. Accordingly, the column line select signal is always sufficiently delayed with respect to the wordline signal such that read out of the bitlines is only executed when the potential of the bitlines is in a stationary state. On the other hand the delay is minimal over the whole operating temperature range of the memory device.

Preferably, one type of the transistor $T_1$ is identical to the control transistor provided in the memory cell C. Otherwise, it might be necessary to provide a voltage amplifiers or attenuator between the temperature controlled voltage source VS and the control input of the delay unit DU. In any case, it is necessary to invert the voltage for one of the two complementary transistor types T1, T2.

Figure 5:
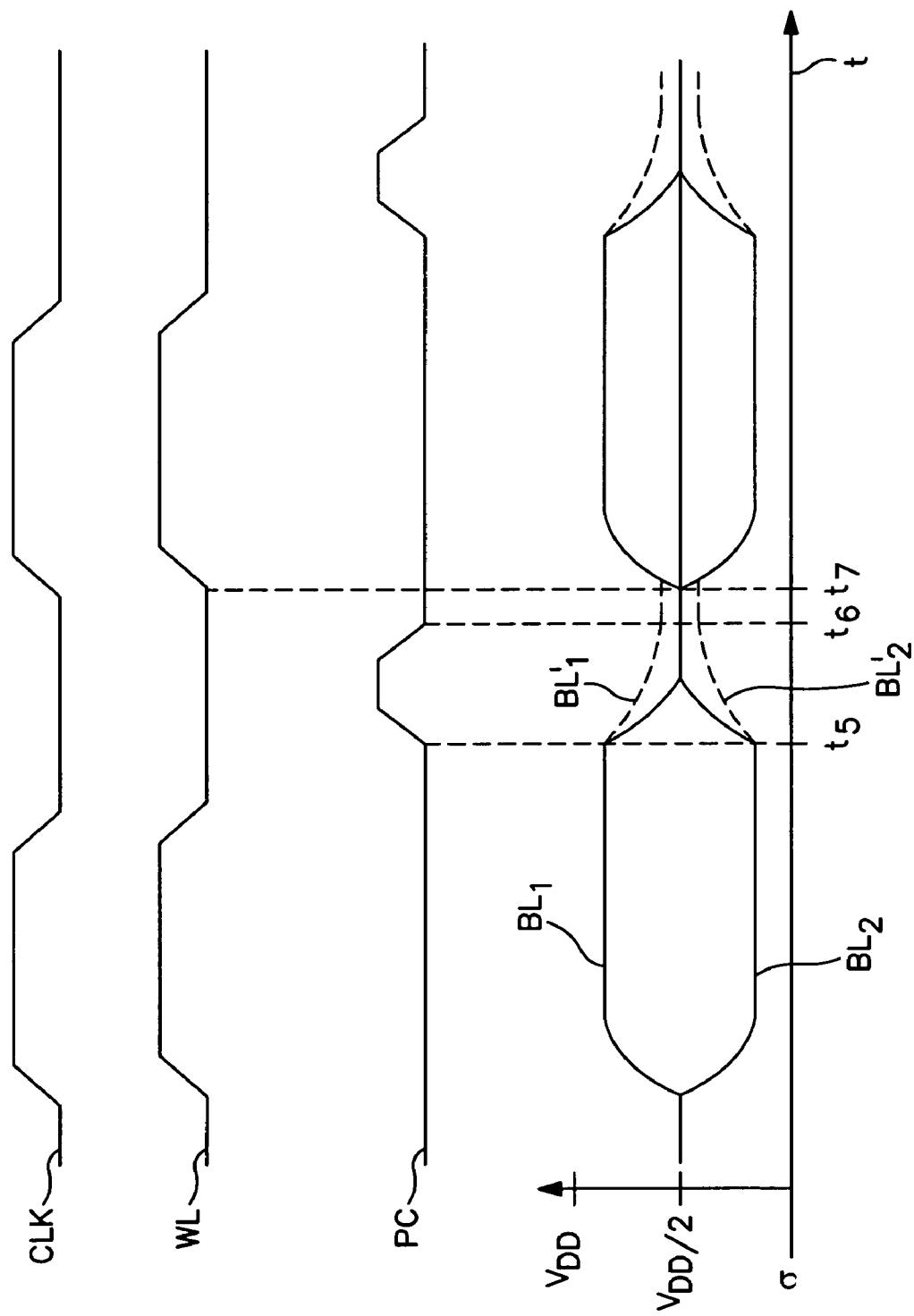
FIG. 5 illustrates a timing diagram of an embodiment of the present invention.
Figure 6:
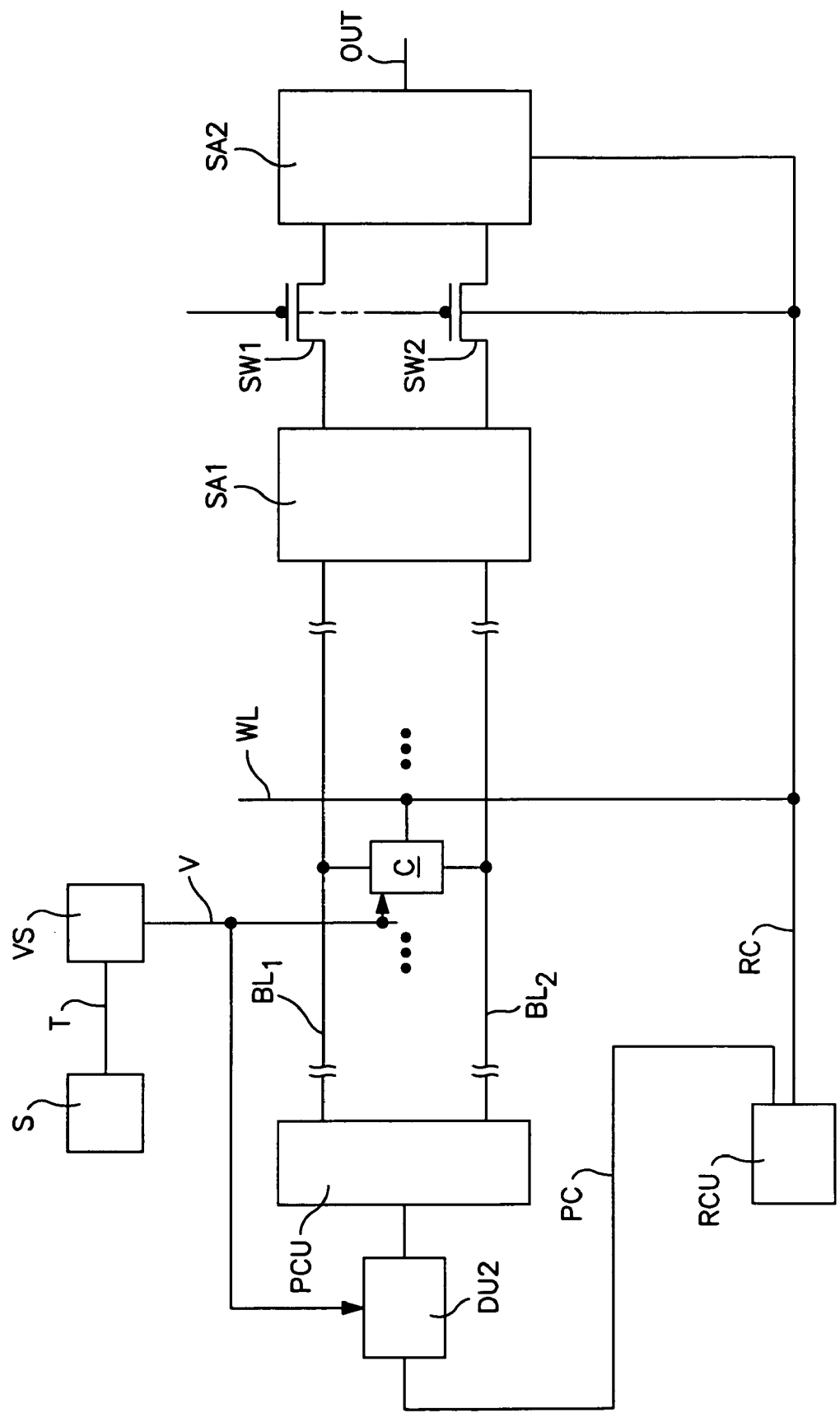
FIG. 6 shows a block diagram of one embodiment of the present invention.

For a reliable operation of a memory device it is necessary to pre-charge and equalize the two complementary bitlines $BL_1$, $BL_2$. This is achieved by a pre-charge control unit PCU. FIG. 5 illustrates the start of the pre-charge operation in a timing diagram. A pre-charge control signal PC is provided by the read control unit RCU as a signal delayed with respect to the wordline signal. At its rising edge (or falling edge) the potential of the true bitline BL is reduced to half the operating voltage $V_{DD}$ and the potential of the complementary bitline $BL_2$ is increased to half the operating voltage $V_{DD}$. After a predetermined time the pre-charge operation is stopped at time point $t_6$. The predetermined time is chosen such that the potential is of bitlines $BL_1$, $BL_2$ are both identical to half the operating voltage $V_{DD}$. The pre-charge operation takes a longer time when the temperature control voltage V is supplied to the memory cell and the respective transistor body. At the time point $t_6$ the bitlines $BL_1'$, $BL_2'$ are unequal to half the operating voltage $V_{DD}$. This may cause an error in the subsequent read out of a neighbouring the memory cell.

In a further preferred embodiment a delay unit DU2 is arranged between the read control unit and the precharge control unit for delaying the end-point of the pre-charge control signal. The delay unit DU2 is connected to the temperature control voltage source VS. The temperature control voltage increases the delay of the ending thus making a pre-charge operation longer with increasing temperatures. A realisation of the delay unit DU2 may be identical or similar to the delay unit DU illustrated in FIG. 4. Additional logic gates may be provided for only delaying the ending but not the beginning of the pre-charge control signal PC.

The present invention has been described in view of preferred embodiments, however, the present invention is not limited thereon.

In particular it is understood that a semiconductor memory device may comprise two delay units, one for delaying the column lines select a signal and a second one for delaying the pre-charge control signal.

The present invention does not relate only to DRAM memory device but in principle relates to all random access memory devices.

Although modifications and changes may be suggested by those skilled in the art, it is the intention of the inventors to embody within the patent warranted heron all changes and modifications as reasonably and properly come within the scope of their contribution to the art.

What is claimed is:

1. A semiconductor memory device, comprising a temperature dependent voltage source for applying a temperature dependent voltage to a first output, said temperature dependent voltage is increasing when a temperature of said semiconductor memory device is increasing and is decreasing when said temperature is decreasing; and at least one memory cell provided with at least one first transistor and a first transistor body, which is connected to said first output of said temperature dependent voltage source; and the semiconductor memory device comprising:
  (a) a read controller for outputting a read control signal;
  (b) a read detection device connected between said read controller and said memory cell, said read detection device reads a content of said memory cell upon receipt of said read control signal; and
  (c) a delay device which is connected between said read controller and said read detection device and delays said read control signal, wherein said delay device comprises at least one second transistor having a second transistor body which is connected to said first output.

2. The semiconductor memory device according to claim 1, wherein said first transistor body has a first conductivity type and a well having said first conductivity type; said well is connected to said first output of said temperature dependent voltage source.

3. The semiconductor memory device according to claim 2, wherein said first conductivity type is a n-type and said voltage of said temperature dependent voltage source is negative.

4. The semiconductor memory device according to claim 1, wherein the delay device is a first delay device, and the semiconductor memory device further comprising:
  (a) a precharge control device for providing a precharge control signal;
  (b) a precharge device, which is connected downstream to said precharge control device and equalizes a potential of two complementary bitlines, both being connected to a memory cell, upon receipt of said precharge control signal; and
  (c) a second delay device, which is connected between said precharge device and said precharge control device, and delays said precharge control signal, wherein said second delay device comprises at least one third transistor having a third transistor body, which is connected to said output.

5. The semiconductor memory device according to claim 4, wherein said second delay device comprises an even number of NOT-gates and at least one of said NOT-gates comprises said third transistor.

6. The semiconductor memory device according to claim 5, wherein at least one of said NOT-gates comprises a fifth transistor which has a fifth transistor body of a second conductivity type, being opposite to said first conductivity type, and said temperature dependent voltage source outputs a second voltage of opposite sign to said voltage at a second output which is connected to said fifth transistor body.

7. The semiconductor memory device according to claim 1, wherein said delay device comprises an even number of NOT-gates and at least one of said NOT-gates comprises said third transistor.

8. The semiconductor memory device according to claim 7, wherein at least one of said NOT-gates comprises a fourth transistor having a fourth transistor body of a second conductivity type which is opposite to said first conductivity type, and said temperature dependent voltage source outputs a second voltage of opposite sign to said temperature dependent voltage at a second output which is connected to said fourth transistor body.

9. A method for operating a semiconductor memory device, which comprises at least one memory cell and a transistor having a transistor body, comprising the following steps:
  (a) determining a temperature of said semiconductor memory device;
  (b) increasing a voltage when said determined temperature increases and decreasing said voltage when said determined temperature decreases; and
  (c) applying said voltage to said transistor body;
  (d) providing a read control signal by a read control device;
  (e) delaying said read control signal by means of a delay device, which comprises at least one second transistor having a second transistor body;
  (f) passing said delayed read control signal to a read detection device;
  (g) reading a content of said one memory cell by said read detection device after receipt of said delayed read control signal; and
  (h) applying said voltage to said second transistor body.

10. The method according to claim 9, wherein the delay device is a first delay device, and the method comprising:
  (a) providing a precharge control signal by a precharge control device;
  (b) delaying said precharge control signal by means of a second delay device, which comprises a third transistor having a third transistor body;
  (c) passing said delayed precharge control signal to a precharge device;
  (d) precharging bitlines connected to said one memory cell after receipt of said delayed precharge control signal; and
  (e) applying said voltage to said third transistor body.

* * * * *